United States Patent [19]
Nagata et al.

[11] Patent Number: 5,793,664
[45] Date of Patent: Aug. 11, 1998

[54] DYNAMIC RANDOM ACCESS MEMORY DEVICE

[75] Inventors: Kyoichi Nagata; Yuji Nakaoka, both of Tokyo, Japan

[73] Assignee: NEC Corporation, Japan

[21] Appl. No.: 787,237

[22] Filed: Jan. 22, 1997

[30] Foreign Application Priority Data

Jan. 25, 1996 [JP] Japan ................................. 8-010527

[51] Int. Cl.$^6$ ........................................ G11C 5/06
[52] U.S. Cl. ........................ 365/72; 365/51; 365/63; 365/226
[58] Field of Search .................... 365/51, 63, 72, 365/230.03, 226, 208, 207, 203

[56] References Cited

U.S. PATENT DOCUMENTS 5,535,153 7/1996 Saeki ............................ 365/72

OTHER PUBLICATIONS

"A 29ns 64Mb DRAM with Hierarchical Array Architecture" Nakamura et al 1995 IEEE International Solid–State Circuits Conference; pp. 246–247.

Primary Examiner—David C. Nelms
Assistant Examiner—Hoai Ho
Attorney, Agent, or Firm—Hayes, Soloway, Hennessey, Grossman & Hage, P.C.

[57] ABSTRACT

In a memory in which a memory cell array 200 and a subword drive circuit SWD are alternately arranged in a row direction in addition to an SA array 170 and a cross portion (SWC) alternately arranged, there are arranged an interface circuit 100 between a global I/O line GIOT/B and a local I/O line LIOT/B in a first cross portion SWD1, nMOSs Q2, Q4, and Q5 of an SA control circuit in a second cross portion SWC2, and pMOSs Q1 and Q3 of the SA control circuit in a third cross portion SWC3.

4 Claims, 9 Drawing Sheets

DYNAMIC RANDOM ACCESS MEMORY DEVICE

BACKGROUND OF THE INVENTION

1. Field of the Invention

The present invention relates to a semiconductor memory device, and more particularly, to an improvement in layout of a dynamic random access memory device (DRAM).

2. Related Background Art

In a DRAM having a very large memory capacity, it is necessary to employ a partitioned decoding system for selecting one or more memory cells designated by address information. In this case, a memory cell array is also required to be divided into a plurality of blocks. Further, a two-word lines system having main-word line and sub-word lines is employed. Such a conventional DRAM is described in ISSCC95, A 29ns 64 Mb DRAM with Hierarchical Array Architecture (p. 246).

Figure 9:
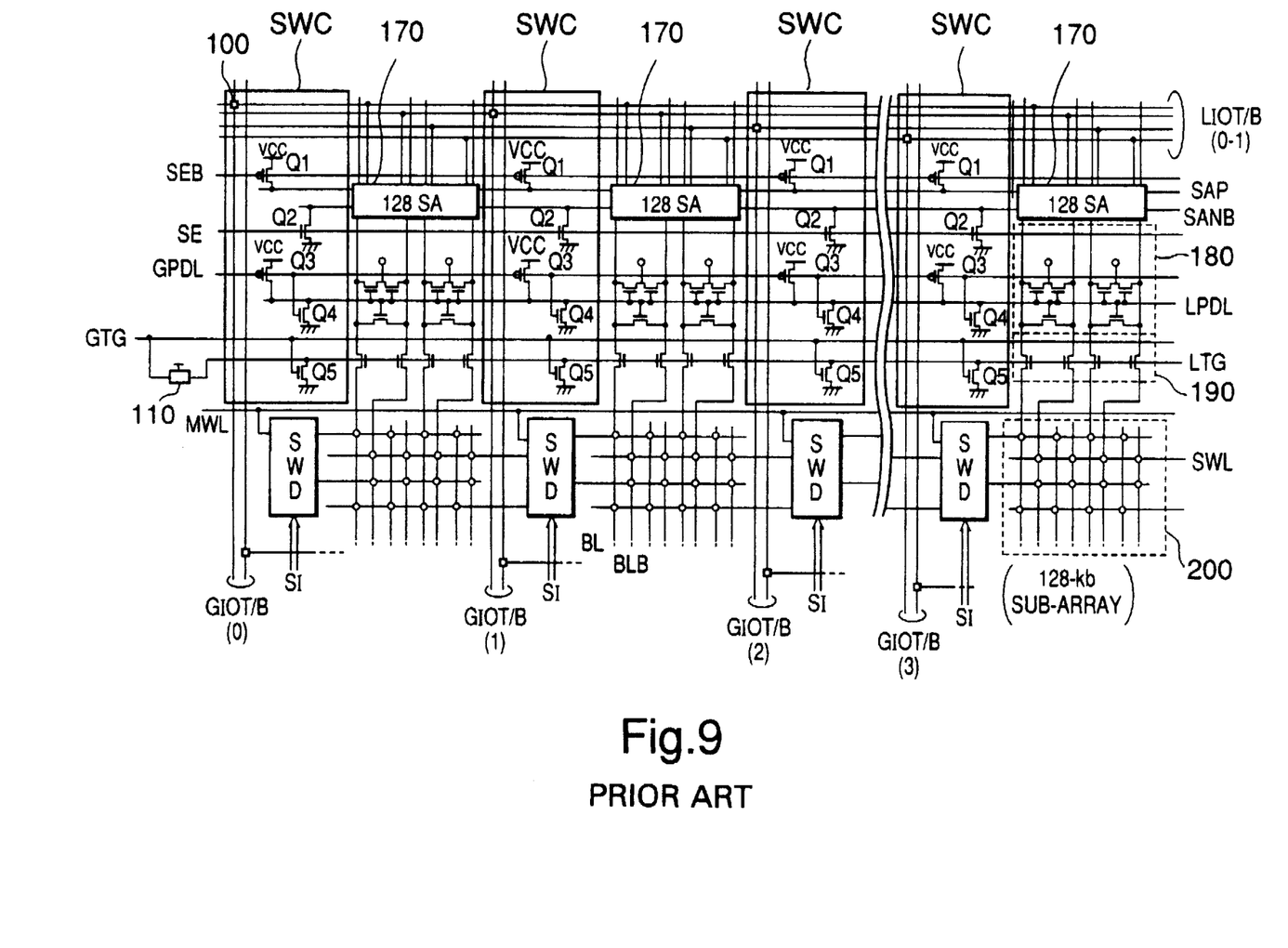
FIG. 9 is a circuit configuration diagram of a conventional Dram device.

Referring to FIG. 9, there is shown a part of such a conventional DRAM having the partitioned decoding system. FIG. 9 shows a circuit only of a single row of memory cell arrays in order to simplify the explanation thereof, in which three memory cell array blocks 200 arranged in one row. Between the memory cell array blocks 200, there are arranged subword driver circuits SWD in a row direction. Sense amplifier arrays 170 includes sense amplifiers (SA) provided in a column direction. Each of the sense amplifiers is of a flip-flop type as is well known in the art. Each sense amplifier array 170 is connected to a corresponding memory cell array 250 (not shown) which exists in the upper part of this diagram having the same configuration as for the memory cell array 200 in the lower part of the diagram. Additionally, in the cross-over portion of the sense amplifier array row and the subword driver circuit column, an SA array row/SWD column cross portion SWC is arranged.

In this cross portion SWC, there are provided a local/global interface circuit 100 for controlling a connection or a disconnection between a global I/O line GIOT/B, and a local I/O line LIOT/B, and a so-called sense amplifier control circuit including p-channel MOS transistors (hereinafter, pMOSs) Q1 and Q3 and n-channel MOS transistors (hereinafter, nMOSs) Q2, Q4, and Q5.

The pMOSs are used to enable the sense amplifiers 170 and are controlled by a first sense-enable signal SEB to drive a first power line SAP to a VCC level (hereinafter, the high level) when the SEB shifts to a GND level (hereinafter, the low level). The power line SAP is connected in common to the sense amplifiers SA. The nMOSs Q2 are also used to enable the SAs and are thus a second sense-enable signal SE to drive a second power line SANB to the low level when the SE shifts to the high level. The power line SANB is also connected in common to the SAs 170.

The pMOS Q3 and the nMOS Q4 are controlled by a global precharge signal GPDL to supply a local precharge signal LPDL. In other words, when the GPDL is at the low level, the pMOSs Q3 are turned on to raise the LPDL to the high level. When the GPDL is at the high level, the nMOSs Q4 are turned on to drop the LPDL to the low level. The nMOSs Q5 are controlled by a global transfer gate signal GTG, so that they are turned on when the GTG is at the high level so as to drop a local transfer gate signal LTG to a low level to which a step-up potential is given by a step-up circuit 110 to the low level. The step-up circuit 110 is a circuit for outputting a step-up voltage of (VCC+nMOS threshold voltage $V_{TN}+\alpha$) and the low level signal by receiving the GTG for supplying low-level and high-level potentials and then inverting them. Each of the step-up circuits 110, the interface circuits 100, and the sense amplifier are composed of a CMOS circuit.

Between the memory cell array 200 and the SA array 170, there are arranged a precharging circuit 180 for precharging a bit line in an SA side and a bit line transfer gate 190 for controlling a connection and a disconnection between the bit line in the SA side and a bit line in a memory cell side. The precharging circuit 180 is activated by the high level of the signal LPDL to precharge each of the bit lines to a half Vcc level(½ Vcc).

Figure 10:
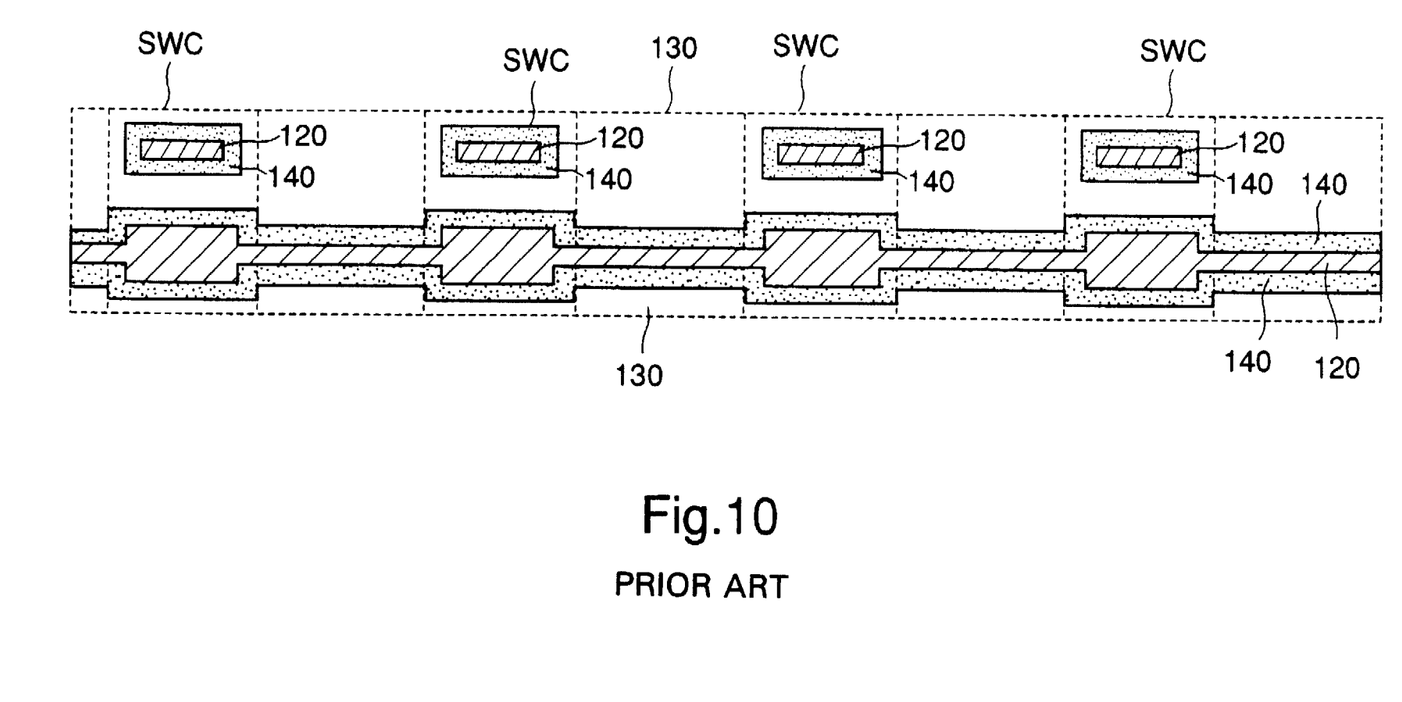
FIG. 10 is a well layout diagram of the conventional Dram device of FIG. 9.

FIG. 10 shows a layout of wells for realizing the conventional circuit in FIG. 9. In a cross portion SWC, an n-well region 120 is provided at two places for a layout of wiring in addition to a p-well region 130. In the cross portion SWC, there are two metal lines (not shown), one of which is used as a line passing through the cross portion SWC and the other of which is used as a voltage input line. Lines connected to the n-well region 120 with the P-well region 130 do not use the metal lines and use the same silicate lines as the bit lines. The resistance value of the silicate lines is larger than the metal line. The lines which the transistors Q1–Q5 use must be as short as possible to prevent from the delay of the lines themselves. Moreover, in the cross portion SWC, manu logic circuits such as inverter circuits and NAND circuits are formed (not shown). The logic circuits use the silicate lines to connect p-well 130 with the n-well region 120 in which it the logic circuits are formed. The lines, which the logic circuits use, must be as short as possible. Therefore, the n-well region 120 is provided at two or more places. A pn-separation region 140 is arranged between these wells. The pn-separation region 140 is the region in which, for example, transistors cannot produced. The pn-separation region 140 is produced by Locus method, the trench method, or by reverse bias of the voltage. An n-well region 120 is provided in an SA region between SWCs in addition to a p-well region 130, with the n-well region formed so as to be connected to an n-well region 120 of an adjacent SWC.

In the cross portion SWC, a pMOS Q3 and a PMOS of the interface circuit 100 are formed in an upper n-well region 120 (in the drawing) and a pMOS Q1 is formed in a lower n-well region 120. In a p-well region of the SWC, an nMOS of the interface circuit 100 is formed in addition to nMOSs Q2, Q4, and Q5. A pMOS of the SA is formed in an n-well region 120 in the SA region, and an nMOS of the SA and an nMOS forming the bit line precharging circuit 180 and the bit line transfer gate 190 are formed in a p-well region 130 in the SA region.

In the above conventional system of FIGS. 9 and 10, since the pMOS and the nMOS are formed on all the SA array row/SWD column cross portions SWCs and it is required to divide the n-well region into two sections for its formation, a large-sized pn-separation region is needed. Therefore the pn-separation region is a relatively large area of the cross portion SWC. In addition, the length of the wire increases due to the larger area, and the amount of wiring between the pMOS and the nMOS is also increased, which leads to an access time delay. Furthermore, a skew problem (a time-lag problem) becomes serious due to the wiring delay.

Additionally in a conventional example, the step-up circuit 110 is placed at a single portion in the outside of the SWCs and therefore the wiring delay at a place far from the step-up circuit becomes serious, which also increases a time-lag due to a distance from the step-up circuit at this point.

SUMMARY OF THE INVENTION

It is therefore an object of the present invention to provide a semiconductor memory having a decreased SWC area by minimizing the pn-separation region on the SWC.

It is another object of the present invention to provide a semiconductor memory in which wiring in an SWC is shorter so as to minimize the access time delay.

It is still another object of the present invention to provide a semiconductor memory in which step-up circuits for driving a bit line transfer gate are arranged separately so as to decrease the delay of a step-up signal.

A semiconductor memory device of the present invention comprises a semiconductor chip having first and second areas, the first area being including first, second, third and fourth portions which are arranged in a line in that order in a first direction, a plurality of memory cells formed in the second area, a first sense amplifier circuit formed in the first portion of the first area and provided for associated ones of the memory cells, a second sense amplifier circuit formed in the third portion of the first area and provided for associated ones of the memory cells, each of the first and second amplifier circuits having first and second power nodes, a first line extending over the first area in the first direction and connected in common to the first power node of each of the fist and second sense amplifier circuits, a second line extending over the first area and connected in common to the second power node of the first and second sense amplifier circuits, a first power source line extending over the first area in the first direction, a second power source line extending over the first area in the first direction, at least one first transistor of a first channel type formed in one of the second and fourth portions of the first area and connected between the first line and the first power source line to form, when activated, a current path therebetween, and at least one second transistor of a second channel type formed in the other of the second and fourth portions of the first area and connected between the second line and the second power source line to form, when activated, a current path therebetween, said one of the second and fourth portions of the first area including no such a transistor that is connected between the second line and the second power source line and the other of the second and fourth portions of the first area including no such a transistor that is connected between the first line and the first power source line.

As described above, in a semiconductor memory of the present invention, the pMOS for supplying a high potential to the sense amplifier, and the nMOS for supplying a low potential to the sense amplifier are arranged in cross portions SWCs different each other, and hence it is possible to form only a pMOS and only an nMOS in the SWC containing the pMOS for supplying a high potential to the sense amplifier and the SWC containing the n-channel transistor for supplying a low potential to the sense amplifier, respectively and it does not need to provide a pn-separation region in each SWC, so that the entire area is decreased by the pn-separation region.

Accordingly, a chip area can be reduced and wiring in each SWC can be, minimized and therefore, it is possible to minimize the access time delay. As a result, the skew problem caused by the wiring delay can be significantly reduced.

BRIEF DESCRIPTION OF THE DRAWINGS

The above and other objects, advantages, and features of the present invention will be more apparent from the following description taken in conjunction with the accompanying drawings, in which.

DETAILED DESCRIPTION OF THE PREFERRED EMBODIMENTS

Figure 1:
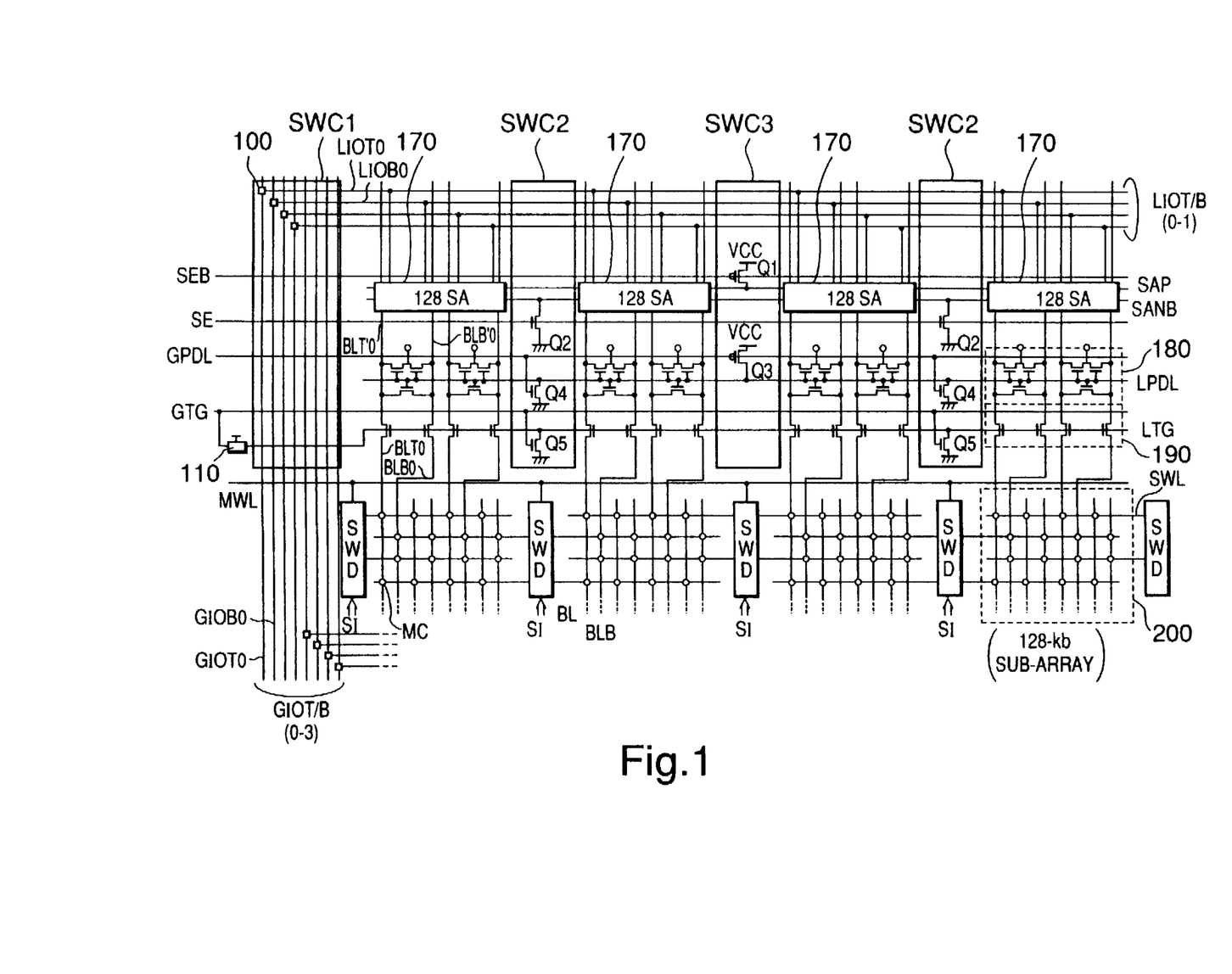
FIG. 1 a circuit diagram of a first embodiment of the present invention.
Figure 2:
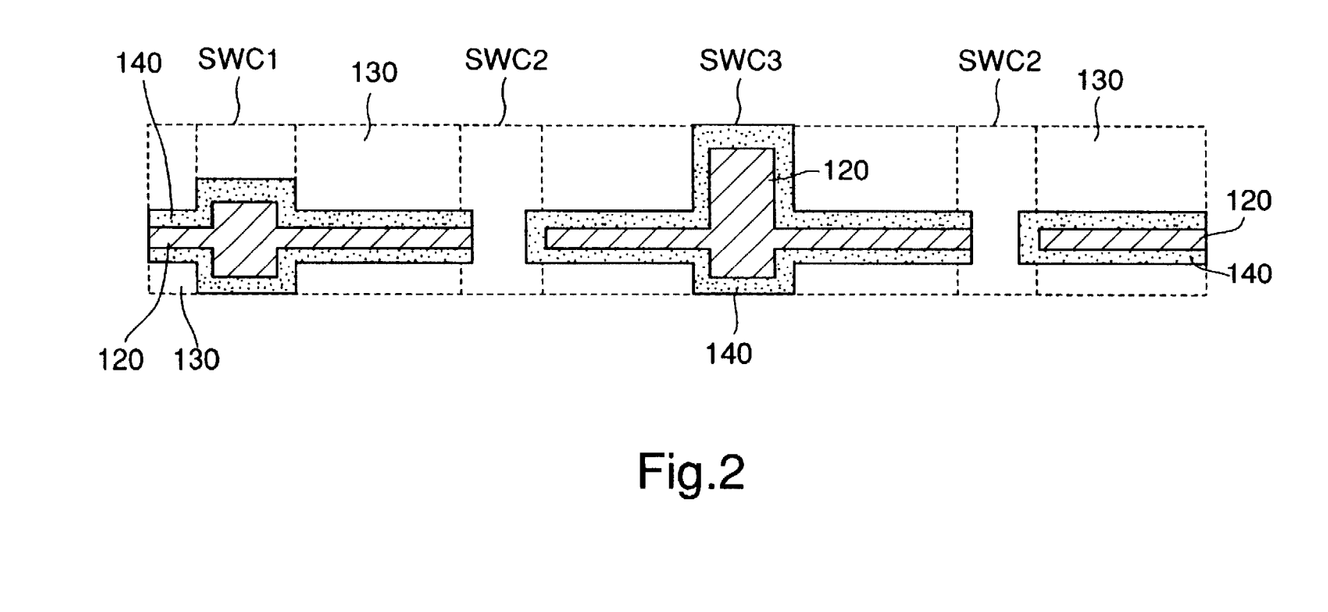
FIG. 2 is a well layout diagram of the first embodiment of the present invention.

FIG. 1 is a circuit diagram illustrating a first embodiment of the present invention. Additionally, a layout of a well configuration in the first embodiment is shown in FIG. 2.

Configurations of an SA array 170, a subword driver circuit SWD, a bit line precharging circuit 180, a bit line transfer gate 190, and a memory cell array 200 are the same as for a conventional example. Three types of SA array row/SWD column cross portions SWC1, SWC2, and SWC3 having different functions are arranged in cross-over regions of an SA array row and an SWD column. A main word line MWL is connected to each SWD in row. In the SWD, selection information SI has been entered for selecting a single subword line. An SWD connected to an active MWL activates a single SWL in response to an activated selection information SI.

Figure 3:
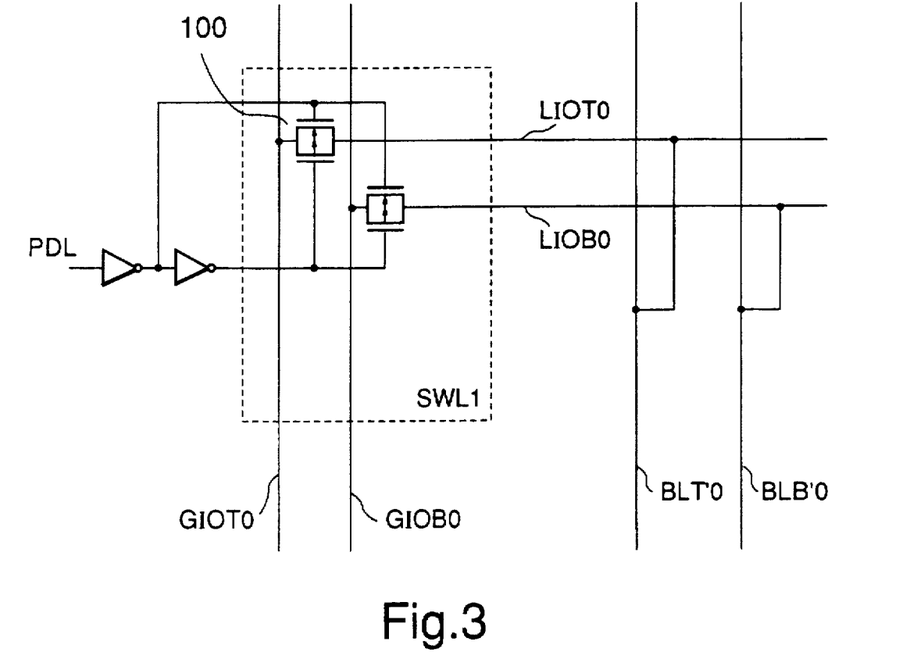
FIG. 3 is another circuit diagram of a first embodiment of the present invention.

In a cross portion SWC1, there are arranged local/global interface circuits 100 for controlling connection or disconnection between a local I/O line LIOT/B and a global I/O line GIOT/B. The interface circuit 100 comprises a CMOS transfer gate shown in FIG. 3. Therefore, as shown in FIG. 2, there is an n-well region 120, a p-well region 130, and a pn-separation region 140 in the SWC1. In addition, a CMOS logic circuit is also arranged in the SWC1, though it is not shown in this drawing.

In a cross portion SWC2, there are arranged nMOSs, such as: an nMOS Q2 for dropping an SA drive signal SANB to the low level by being set on when an SA driver control signal SE shifts to the high level, an nMOS Q4 for dropping a local precharge signal LPDL to the low level by being set on when a global precharge signal GPDL shifts to a high level, and an nMOS Q5 for dropping a local transfer gate signal LTG to the low level by being set on when a global transfer gate signal GTG shifts to the high level. Unlike the prior art of FIG. 9, there are no pMOS's arranged in SWC2.

Also, in the SWC2 region, there is no n-well region as shown in FIG. 2, rather, the pn-separation regions 140 are protruding from n-well regions of sense amplifier portions.

In a cross portion SWC3, there are arranged a pMOS Q1 for raising an SA drive signal SAP to, a high level by being set on when an SA driver control signal SEB shifts to the low level and a pMOS Q3 for raising a local precharge signal LPDL to a high level by being set on when the global precharge signal GPDL shifts to the low level. There are no pMOS arranged in the region.

Accordingly, in this SWC3 region, only an n-well region 120 and a pn-separation region 140 are formed without any p-well, region as shown in FIG. 2.

The size of the cross region SWC 1 is 30 –40 μm. The width of the pn-separation region 140 is 5–8 μm. The total width of the pn-separation region 140 is 10–16 μm. On the other hand, the cross region SWC of the conventional circuit shown in FIG. 10 has two n well regions. Thus, the total width of the pn-separation region 140 in the cross region SWC of the conventional circuit is 20–32 μm. In other words, the cross region SWC of the above-mentioned conventional circuit is larger than that of the present invention.

The gate width of the pMOSs Q1 and Q2 of the present invention is 35 μm and 108 μm respectively. The gate width of the nMOSs Q2, Q4 and Q5 of the present invention is 150 μm, 72 μm, 72 μm respectively. The gate lengths of the MOSs Q1–Q5 are 0.5 μm respectively. Thus, the cross regions SWC of the present invention is provided with fewer transistors than that of the above-mention conventional circuit, and has the pn-separation region which is smaller than that of the conventional circuit. For this reason, the size of the transistors Q1–Q5 can be larger than that of the conventional circuit although the area size of the cross region SWC1–SWC3 is smaller than that of the conventional circuit. The gate width of the pMOSs, Q1 and Q3 of the conventional circuit is 80 μand 27 μm, respectively. The gate width of the nMOS, Q2, Q4 and Q5 of the conventional circuit is 75 μm 36 μm, and 36 μm respectively. The driving ability of transistors Q1–Q5 in FIG. 1 is the same as that of the transistors Q1s–Q5, respectively in FIG. 9.

A precharge circuit 180 is provided in a upper p-well region 130 and a lower p-well region 130. Moreover, a transfer gate 190 is provided in lower side of the upper p-well region.

Next, operation of the memory circuit of this embodiment will be described below. First, a readout operation is explained. Previous to the readout operation, a bit line pair in the SA side, for example, BLO'0, BLB'0 is precharged. At this point, SA drive signals SAP and SANB have been also precharged by a precharging circuit PDL (not shown), formed in the SWC. The global transfer gate signal GTG is at the high level and therefore the LTG is at the low level and a transfer gate 190 is put in an off state.

Figure 4:
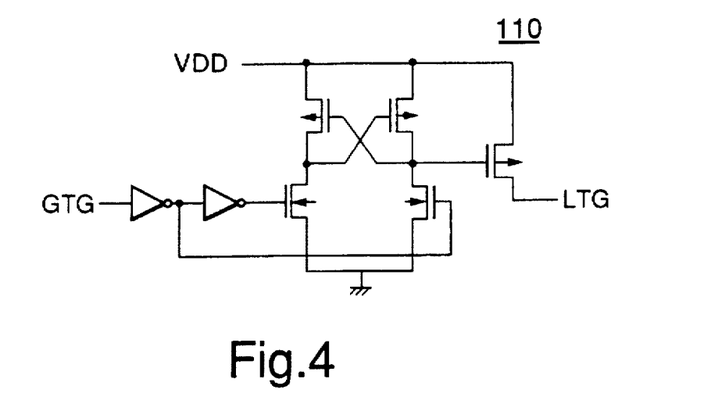
FIG. 4 is a circuit diagram of the circuit 110 shown in FIG. 1.

If the SWD selects a single subword line SWL, stored data in a memory cell connected to the subword line is read out to bit line pairs in the memory cell side, for example, BLT0, and BLB0. The GTG drops to the low level, the step-up circuit 110 shown in FIG.4 generates a step-up voltage, and the nMOS Q5 is turned off. Therefore, the LTG is kept to a step-up potential and a bit line transfer gate 190 is set to on. This makes the bit line data in the memory cell side to be read out to the side of the SA bit line. Next, the SA driver control signal SE shifts to the high level and the SA drive signal SANB drops from the ½VCC to the low level. Subsequently, the SA driver control signal SEB shifts to the low level and the SA drive signal SAP goes up from the ½VCC to the high level. As a result, the SA is activated so as to amplify the readout data.

The readout data is transmitted to the local I/O line LIOT/B, for example, LIOT0,LIOB0 and then the interface circuit 100 is turned on, whereby it is transmitted to the global I/O line GIOT/B GIO0,GIOB0 via the interface circuit 100 so as to be externally read out. Meanwhile, after the subword line SWL shifts to the low level, the GTG goes up to the high level, the step-up circuit 110 is turned off, the LTG.shifts to the low level, and then the transfer gate 190 is set to off. Afterward, the SEB shifts to the high level and the SE to the low level so as to deactivate the SA, and then the global precharge signal GPDL shifts to the low level. It raises the local precharge signal LPDL to the high level so as to turn on all the nMOSs of the precharging circuit 180. Accordingly, the SA bit line pair is precharged at the ½VCC level to prepare for a subsequent readout operation.

For a write operation, data is transferred in an order reverse to the above order so as to be written into a memory cell. In other words, data on the GIOT/B is transmitted to the LIOT/B side via the interface circuit 100 and then amplified by the SA array 170. This amplified data is transmitted to a bit line in the memory cell side by turning on the bit line transfer gate 190 and then the data is written into a memory cell selected by the subword driver array SWD.

In this embodiment, SWC1 to SWC3 are arranged repeatedly by the number of the divisions of memory cell arrays in a repeated order of SWC1, SWC2, SWC3, SWC2, SWC1. Alternatively, this order need not always be used as the arrangement and the ratio of the SWC2 to the SWC3 need not always be 2 to 1.

A The gate width of the pMOS Q1 is 350 μm and the gate width of the nMOS Q2 is 15 μm. That is why the drive ability of nMOS is twice or more larger than that of pMOS. The area provided nMOS Q2 is therefore smaller than the area provided pMOS Q1. Accordingly, in this embodiment, the cross portion SWC2 has a unused space. The second embodiment of the present invention proposes how to use the unused space effectively.

Figure 5:
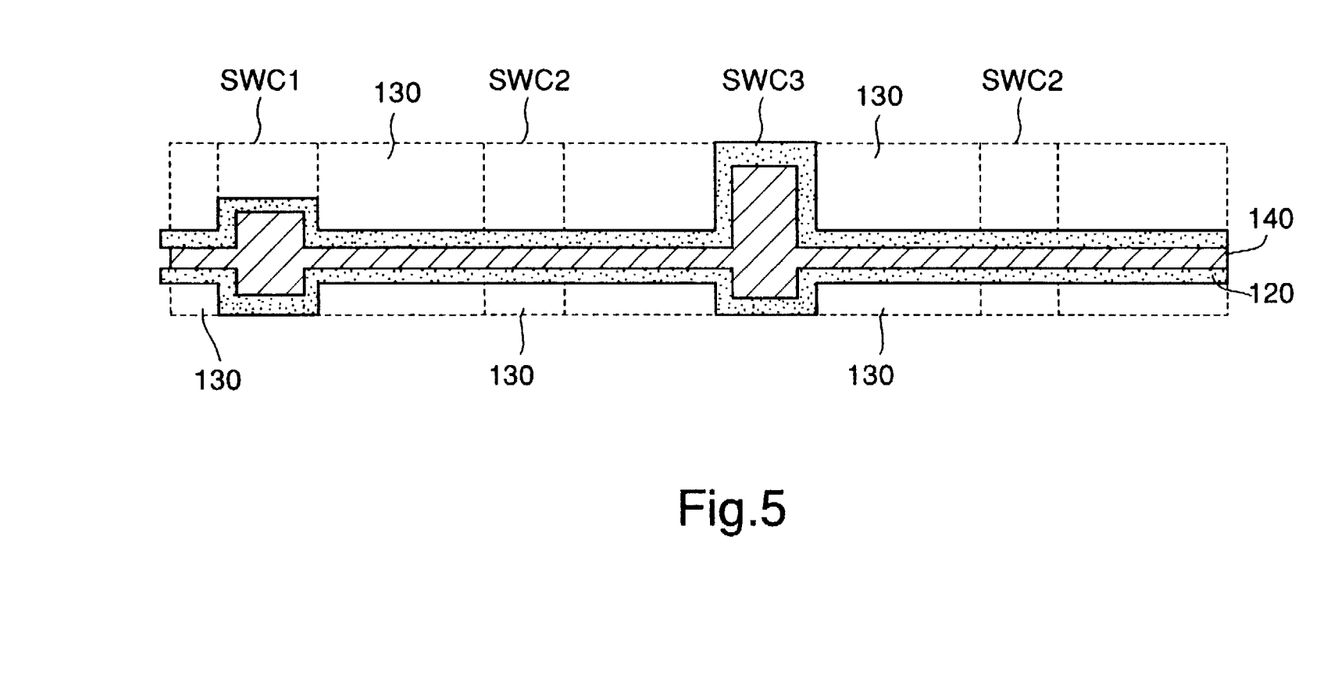
FIG. 5: is a well layout diagram of a second embodiment of the present invention.
Figure 6A:
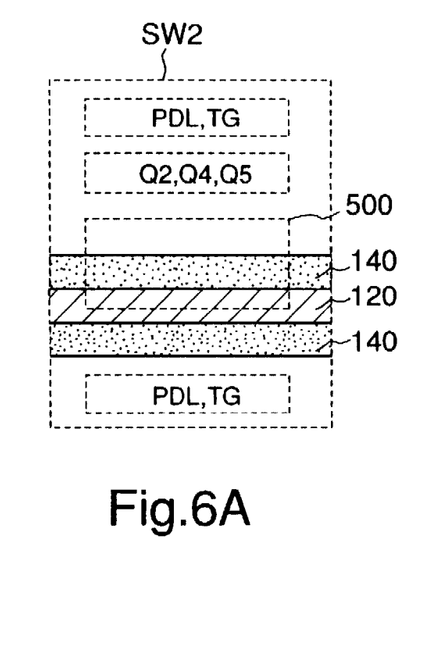
FIGS. 6A and 6B are a well layout of SWC2 and a circuit diagram shown in FIG. 5 respectively.
Figure 6B:
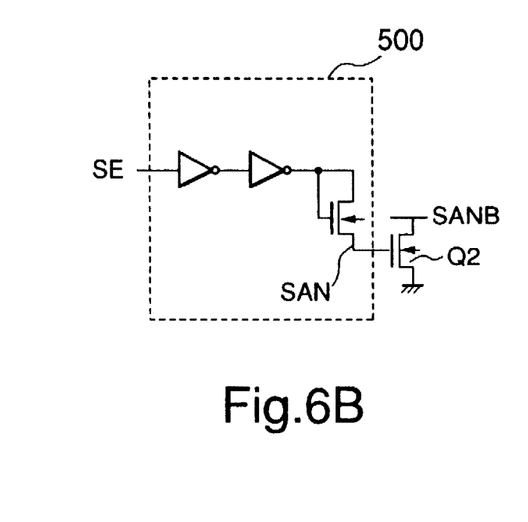

FIG. 5 is a layout diagram of a well configuration in a second embodiment of the present invention. The circuit configuration of a portion shown in FIG. 1 is the same as for the second embodiment and therefore a circuit diagram of the second embodiment is omitted. The second embodiment differs from the first embodiment in that an n-well region 120 of a sense amplifier portion and a pn-separation region 140 are protruding straight into a cross portion SWC2. That is, the n-well region 120 and the pn-separation region 140 of this embodiment account for the unused space. As a result, an n-well region is formed in the SWC2 region, so that a pMOS can be placed in that region. Accordingly, a CMOS circuit can be formed in the SWC2 so as to make it possible to place a buffering inverter circuit 500 shown in FIGS. 6A and 6B for driving a large-sized transistor such as a sense amplifier drive transistor. Moreover, in p-well region 130 of the region SWC2, a precharging circuit PDL and a timing generator TG is arranged shown in FIG. 6A.

Figure 7:
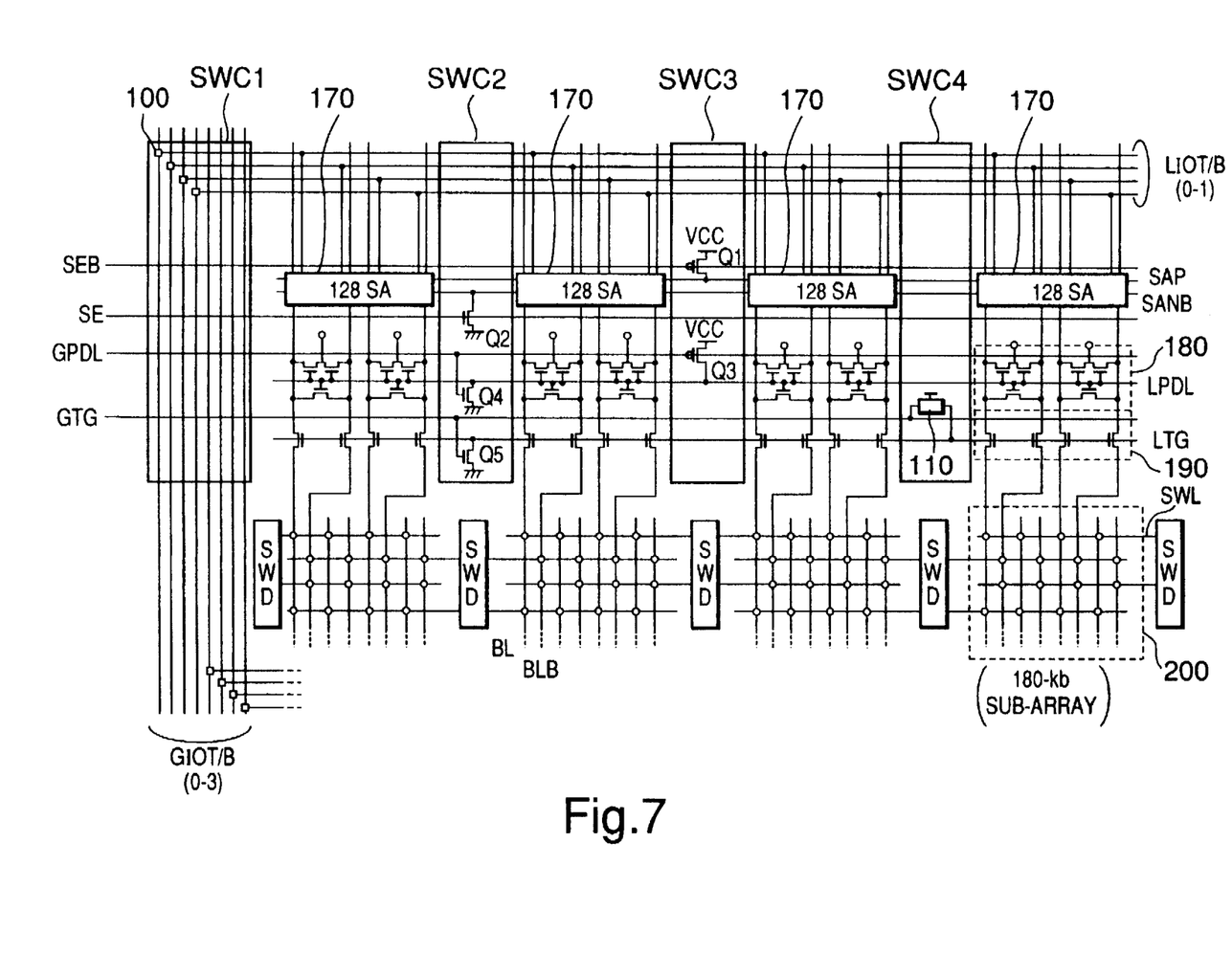
FIG. 7 a circuit diagram of a third embodiment of the present invention.

FIG. 7 is a circuit diagram illustrating a third embodiment of the present invention. In addition, a layout of a well configuration in the third embodiment is shown in FIG. 8.

In this embodiment, a cross portion SWC4 is added to cross portions SWC1, SWC2, and SWC3, and then a step-up circuit 110 is arranged in this region. As a result, the step-up circuit 110 can be placed, for example, by every four cross portions though only a single step-up circuit 110 is placed outside the memory cell array portion in the first and second embodiments. Therefore, a transmission time delay caused by the large distances between the step-up circuits can be minimized, which leads to a significant reduction of the rise time of a step-up voltage.

Figure 8:
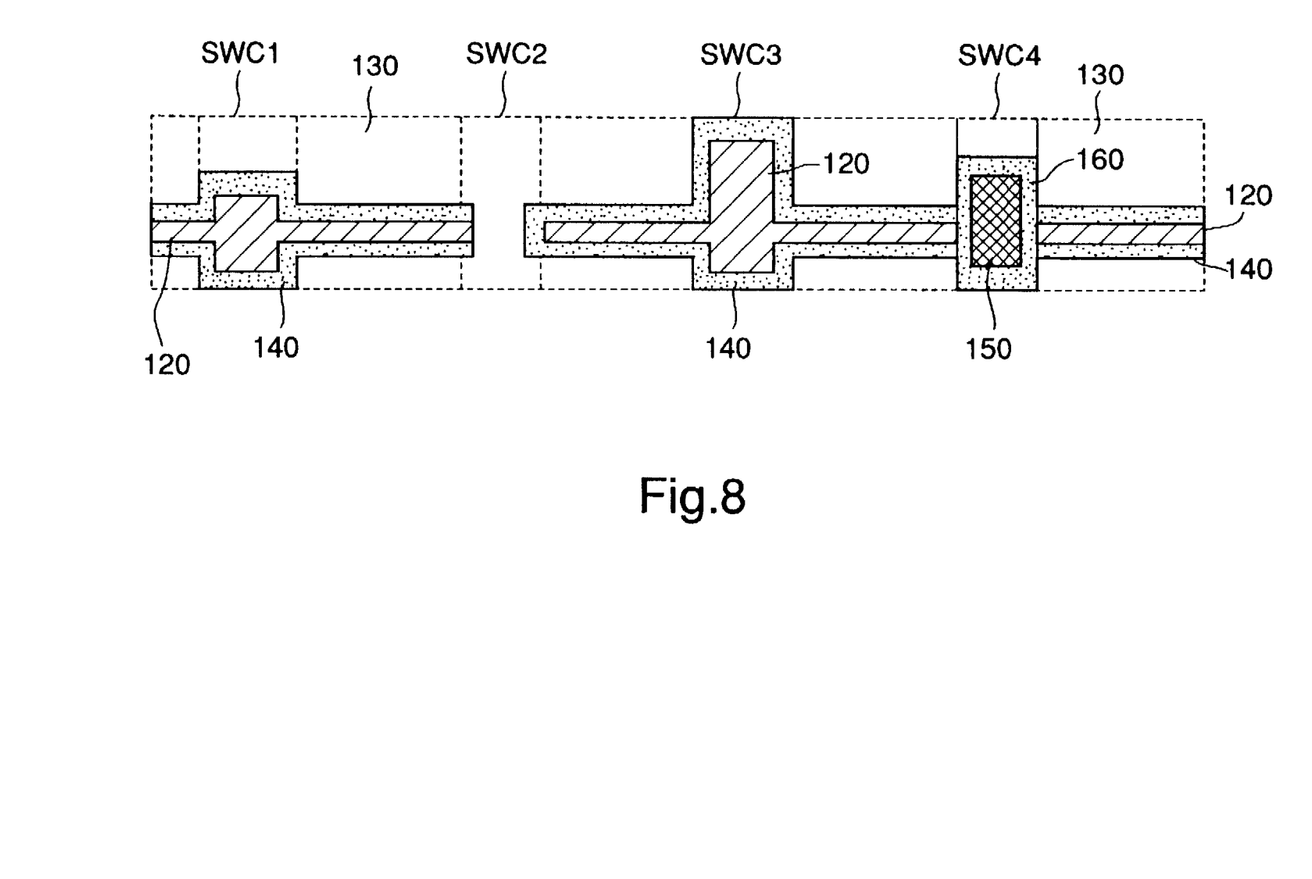
FIG. 8 is a well layout diagram of the third embodiment of the present invention.

As shown in FIG. 8, in the SWC4, there is an n-well region 150 for a step-up circuit and a step-up circuit separation region 160 to which a higher substrate potential is given than those for a p-well region 130 and an n-well region 120, which makes it possible to arrange a step-up circuit having a CMOS configuration.

In this embodiment, SWC1–SWC4 are arranged repeatedly by the number of the divisions of the memory cell array in an order of SWC1, SWC2, SWC3, SWC4, SWC1, and the like, but they need not always be arranged in this order and it is not necessary to place the same number of the respective cross portions SWC1 to SWC4.

Furthermore, the number of nMOSs Q2, Q4, Q5 and pMOSs Q1, Q3 of the present invention is fewer than the number of them of the above-mentioned conventional circuit. In addition, each nMOS and pMOS of the present invention can be made larger than each of their counterparts of the conventional circuit. The sense amplifier control circuit of the present invention, therefore, has a high drive ability which is higher than that of the conventional circuit.

As described in the above embodiments, the semiconductor memory of the present invention has the SA array row/SWD column cross portions each of which contains the local/global interface circuit, the nMOS for driving the SA control circuit, or, the pMOS for driving the SA control circuit separately. Therefore, a p-well can be arranged in the cross portion in which the nMOS is formed and an n-well can be arranged in the cross portion in which the pMOS is formed, and thus, there is no need to provide a pn-separation region in these cross portions. Accordingly, in these regions, their areas are reduced by the pn-separation region and hence higher-density integration is obtained. In addition, the subword driver circuit and the sense amplifier array can be minimized without being limited by block sizes of the cross portions.

Furthermore, according to the present invention, there is no need for a wiring connection between the pMOS and the nMOS of the SA control circuit in the cross portion; thus minimizing the wiring delay and access skew problem associated with the prior art.

Still further, according to the embodiment in which the n-well region and the pn-separation region are extended from the SA array portion to the cross portion in which the nMOS of the SA control circuit is formed so as to pass through the region, a CMOS circuit can be arranged in this cross portion and therefore a buffering function of an n-channel drive transistor is obtained so as to start a drive transistor at a high speed. Then, according to the embodiment in which the step-up circuits are arranged in the cross portion, the step-up circuits can be dispersed and therefore a wiring delay of a step-up voltage is reduced thereby obtaining a high-speed access.

Although the preferred embodiments of the present invention have been described in detail, it should be understood that various changes, substitutions, and alterations can be made therein without departing from the spirit and scope of the invention as defined by the appended claims.

What is claimed is:

1. A semiconductor memory device comprising a semiconductor chip having first and second areas, said first area including first, second, third and fourth portions which are arranged in a line, respectively, in a first direction, a plurality of memory cells formed in said second area, first, second, third and fourth sense amplifier circuits formed in said first, second, third and fourth portions, respectively, of said first area and provided for associated ones of said memory cells, each of said amplifier circuits having first and second power nodes, a first line extending over said first area in said first direction and connected in common to said first power node of each of said sense amplifier circuits, a second line extending over said first area and connected in common to said second power node of said sense amplifier circuits, a first power source line extending over said first area in said first direction, a second power source line extending over said first area in said first direction, at least one first transistor of a first channel type formed only in one of said second and fourth portions of said first area and connected between said first line and said first power source line to form, when activated, a current path therebetween, and said other of said second and fourth portions of said first area including no such a transistor that is connected between said first line and said first power source line, and at least one second transistor of a second channel type formed only in said third portion of said first area and connected between said second line and said second power source line to form, when activated, a current path therebetween, each of said second and fourth portions of said first area including no such a transistor that is connected between said second line and said second power source line.

2. The device as claimed in claim 1, wherein each of said sense amplifier circuits further includes a plurality of bit lines coupled to said associated ones of said memory cells and a plurality of precharging transistors each formed in said first, second, third and fourth portions of said first area and each connected between a precharge potential level line and an associated one of said bit lines, said device further comprising a third line extending over said first area in said first direction and connected in common to a gate of each of said precharging transistors, and a third power source line extending over said first area in said first direction at least one third transistor of said first channel type formed only in one of said second and fourth portions of said first area and connected between said third power source line and said third line, and at least one fourth transistor of said second channel type formed in said third portion of said first area and connected between said third power source line and said third line.

3. The device as claimed in claim 2, wherein each of said sense amplifier circuits further includes a plurality of transfer gate transistors each formed in associated ones of said first area to couple an associated one of said bit lines to an associated one of said memory cells, said device further comprising a fourth line extending over said first area in said first direction and connected in common to a gate of each of said transfer gate transistors, and a fourth power source line extending over said first area, in said first direction, and at least one fifth transistor of said first channel type formed only in one of said second and fourth portions of said first area and connected between said fourth power source line and said fourth line.

4. The device as claimed in claim 1, wherein said semiconductor chip further has a third area which cooperates with said second area to sandwich said first area therebetween, said first, second and third areas being arranged in a second direction perpendicular to said first direction, said device further comprising a plurality of first data lines extending over said third area in said first direction and connected to said sense amplifier circuits, and a plurality of second data lines extending outside said first, second, and third areas in said first direction, and a plurality of interface circuits each provided between one of said first data lines and an associated one of said second data lines.

\* \* \* \* \*

UNITED STATES PATENT AND TRADEMARK OFFICE
CERTIFICATE OF CORRECTION

PATENT NO. : 5,793,664
DATED : August 11, 1998
INVENTOR(S) : Kyoichi Nagata and Yuji Nakaoka It is certified that error appears in the above-identified patent and that said Letters Patent is hereby corrected as shown below:

Claim 2, Col. 8, line 33, insert --,-- (comma) after "direction".

Signed and Sealed this

Twenty-seventh Day of October, 1998

Attest:

BRUCE LEHMAN

*Attesting Officer*  *Commissioner of Patents and Trademarks*